Aug. 12, 1969 K. RAITHEL ET AL 3,461,359

SEMICONDUCTOR STRUCTURAL COMPONENT

Filed Jan. 24, 1968

United States Patent Office 3,461,359

Patented Aug. 12, 1969

3,461,359

SEMICONDUCTOR STRUCTURAL COMPONENT

Kurt Raithel, Uttenreuth, and Konrad Reuschel and Wolfgang Keller, Pretzfeld, Germany, assignors to Siemens Aktiengesellschaft, a German corporation Filed Jan. 24, 1968, Ser. No. 700,189
Claims priority, application Germany, Jan. 25, 1967, S 107,983
Int. Cl. H01l 3/00, 5/00
U.S. Cl. 317—234 6 Claims

ABSTRACT OF THE DISCLOSURE

Described is semiconductor component with a flat monocrystalline semiconductor body. This body has across its thickness at least two regions of opposing conductance types with a p-n junction between them. The body contains a substance which forms recombination centers whose solubility decreases in the semiconductor body with decreasing temperature. The semiconductor body is substantially free of dislocations and has an oxygen content of less than $10^{16}$ atoms/cm.$^3$.

Our invention relates to a semiconductor component with a flat, monocrystalline semiconductor body which displays across its thickness at least two zones of two opposite conductance types, with a p-n junction therebetween and containing recombination center forming substance whose solubility in the semiconductor body decreases with decreasing temperatures.

When producing semiconductor structural components, it may be necessary to install heavy metal atoms, which form recombination centers where the recombination and pairing of electrons and holes take place, into flat waferlike monocrystalline semiconductor bodies. Often, however, the atoms which have a favorable capture cross section for minority carriers, have in the semiconductor material, a solubility which decreases at a decrease in temperature. For example gold, which forms, in silicon, recombination centers with a favorable capture cross section, has a solubility which decreases sharply with a decrease in temperature.

The installation of such recombination centers into the semiconductor crystal is important for example in the production of thyristors, which should have a short turn-off time, below 50$\mu$ sec. "Turn-off time" of a thyristor is that time interval between zero current and the time of reapplication of positive forward blocking voltage (trigger voltage) to the thyristor without causing the thyristor to be turned on. This turn-off time depends essentially upon the thyristor properties in the region of the center p-n junction in the semiconductor wafer. If this region has enough recombination centers for the recombination of the current carrier pairs, upon cessation of the current flow, the complete blocking ability of the p-n junction may be restored in a relatively short time.

Furthermore, in "fast diodes," it is necessary to provide in the region of space charges, on both sides of the p-n junction, recombination centers with suitable capture cross section in order to obtain the highest possible limit frequency. "Limit frequency" is the frequency of an alternating voltage applied to a diode, up to which the diode still acts as a rectifier. The recombination centers reduce the so-called carrier crowding effect, i.e. a relatively high flux current following the switching of the diode in blocking direction.

In testing finished semiconductor components of this type into which materials, forming recombination centers and having reduced solubility with decreasing temperatures, were indiffused during production, it could be observed that several had a "soft" characteristic line which is frequently associated with a particularly strong instability in a warm state of operation. In a thyristor, the blocking voltages were unstable in both forward direction (trigger voltage) and in reverse direction. Furthermore such thyristors were frequently observed not to fire uniformly while simultaneously having unusually high values of forward voltage. In the testing of diodes, we repeatedly found unstable blocking voltages and too high voltage drops in forward direction.

We traced the observed shortcomings directly to dislocations in the crystal lattice and to too high amounts of oxygen in the crystal. While generally these dislocations, provided they are not too numerous, and the oxygen content appear to be tolerable and virtually do not affect the usability of semiconductor components, difficulties do occur. These difficulties are apparently due to the simultaneous presence of substances, such as gold, which form recombination centers in the semiconductor crystal. Attempts conducted to eliminate the aforementioned shortcomings by a quick coupling of the semiconductor crystal, following the indiffusion of the material forming recombination centers, met only limited success.

Recombination center forming material, e.g. Fe, Mn, Cu, Ag, whose solubility in the semiconductor body decreases with decrease in temperature, may even already be present in form of undesirable contaminations, although in small concentrations, in the initial semiconductor bodies. In the case of too much oxygen in the semiconductor bodies, the semiconductor components produced therefrom also entailed difficulties even if no additional recombination center forming materials were intentially installed into the semiconductor bodies.

Thus, thyristors of semiconductors which did not have diffused therein additional materials, which form recombination centers and decreasing solubility with decreasing temperature, often had an unexpectedly high forward voltage, low blocking voltages and undefined and not clearly reproducible turn-off times. Similarly diodes also showed high forward and low blocking voltages, as well as undefined and non-reproducible frequency limits.

It is an object of the present invention to eliminate, to a large degree, the observed shortcomings of semiconductor components containing materials in the semiconductor body, which form recombination centers. We achieve this by having the semiconductor body at least almost free of dislocations with an oxygen content of less than $10^{16}$ atoms/cm.$^3$.

According to another, preferred feature of our invention, the median dislocation density across the total area of an arbitrary cross section, parallel to the flat sides of the semiconductor body of the regions, wherein the crystal structure of the crude body was maintained, was less than 1000/cm.$^2$. The local values of the dislocation density, with respect to squares of length equal to the thickness of the semiconductor body, was below 10,000/cm.$^2$.

To obtain a small forward voltage and a uniform firing, especially in thyristors, it is preferable to have the local values of the dislocation density below 10,000/cm.$^2$, with respect to squares whose lateral length is ⅕ the thickness of the semiconductor body.

The aforedescribed shortcomings are easier to avoid in semiconductor components with a flat semiconductor body whose cross section, parallel to the flat sides, is greater than 8 cm.$^2$, provided the median dislocation density over the entire surface amounts to no more than 20,000/cm.$^2$ and its local values, in relation to a square with a length equal to the thickness of the semiconductor body, is below 50,000/cm.$^2$. In this case, a smaller forward voltage and a uniform firing may be achieved, even if the local values of the dislocation density, in a square whose sides are ⅕ of the thickness of the semiconductor body, is below 50,000/cm.$^2$.

The present invention and its advantages will now be explicitly disclosed giving a thyristor as an example; and by means of drawings wherein.

Figure 1:
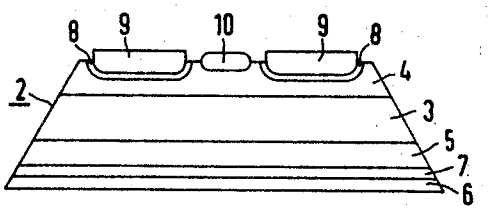
FIG. 1 shows the cross section of a thyristor produced by alloying.

The thyristor of FIG. 1 is comprised of a semiconductor body 2 having an n-conducting core region 3 and two outer, p-conducting diffusion zones 4 and 5. An aluminum electrode 6 is alloyed to the lower flat side of the semiconductor body 2. Between diffusion zone 5 and aluminum electrode 6, lies the recrystallization region 7 which has a large aluminum content and therefore is strongly p-conducting. Alloyed into the upper flat side of the semiconductor body are an annular emitter electrode 9, comprised of a gold silicon eutectic as well as a small p-type wafer control electrode 10, which is also of a gold-silicon eutectic. The annular electrode 9 contacts the n-conducting recrystallization region 8, which acts as an emitter, while the electrode 10 establishes a barrier-free contact with p-conducting base region 4.

To produce a thyristor corresponding to FIG. 1, we use a disc of n-conducting, monocrystalline silicon with a diameter of 32.5 mm, a thickness of 300$\mu$ and a specific resistance below 100 ohm-cm., which is at least almost free of dislocation and which has an oxygen content of less than $10^{16}$ atoms/cm.$^3$. Since, in this case, the total area of the cross section, parallel to the flat sides of the semiconductor disc, amounts to more than 8 cm.$^2$, discs having a median dislocation density of, for example, 13,000/cm.$^2$ on one flat side, may be considered useful, since values up to 20,000/cm.$^2$ appear to be permissible for a disc this size. Particularly low forward voltage values, and uniform firing will be obtained for the thyristor, if the highest value of the local dislocation density, in the cross section parallel to the flat sides, and, thus, in one flat side of the semiconductor disc will be, in a square whose sides are 60$\mu$ long, no more than 50,000/cm.$^2$, e.g. 40,000/cm.$^2$.

Discs having the above properties may be severed, for example, from a silicon rod obtained by means of a special crucible-free zone melting process, during which the entire rod was additionally heated, so that its portions, located outside of the melting zone, had a temperature of approximately 1100° C. to 1200° C. which comes close to the melting point of silicon. One may obtain information concerning the density of dislocations in the semiconductor discs by treating the lapped flat sides of several test samples with an appropriate etching agent such as a mixture of chromic acid and hydrofluoric acids. A so-called "etching pit" forms in places where a dislocation emerges to the surface. These etching pits are counted and the density of the dislocations in one flat side and thereby in each cross section, parallel to the flat sides, is determined thereby. The test results thus obtained, indicate the usefulness of the remaining discs cut from the same silicon rod. For further processing purposes, acceptor material is indiffused, on all sides, into the silicon discs, from a gaseous phase, to produce a p-conducting surface region. The acceptor material may be, for example, gallium, boron or preferably aluminum. The process may take place, for example, in a heated quartz tube, sealed by melting, which holds the silicon discs and a source for doping material.

Subsequently, gold is vapor deposited on a flat side of the silicon discs, at a layer thickness up to 0.1 to 0.5$\mu$. Thereupon the silicon discs are kept for a period of 30 minutes at 860° C. under protective gas or in a vacuum and thereafter quickly cooled so that gold diffuses into the silicon discs and forms recombination centers therein.

An aluminum foil is then alloyed, on the aforementioned flat side of the silicon discs, to form the electrode 6 and the strongly p-conducting recrystallization region 7, while on the other flat side, an antimony containing annular gold foil is alloyed-in to form the electrode 9 and the n-conductive recrystallization region 8, while a disc shaped boron-containing gold foil is alloyed-in to form the control contact 10. Finally, the housing areas of the silicon discs are bevelled, under formation of p-conducting regions 4 and 5, which are separated from each other.

The alloying of metal foils into the flat sides of the silicon discs cause a change in the original dislocation density, directly below the surface, up to a depth which approximately corresponds to the depth of the recrystallization regions. In the cross section, parallel to the flat sides, extending through region 3 and through portions of regions 4 and 5, which were not within recrystallization regions 8 and 7 whose conductance type is determined by the indiffused doping substance, the original dislocation density of the silicon discs remained.

Figure 2:
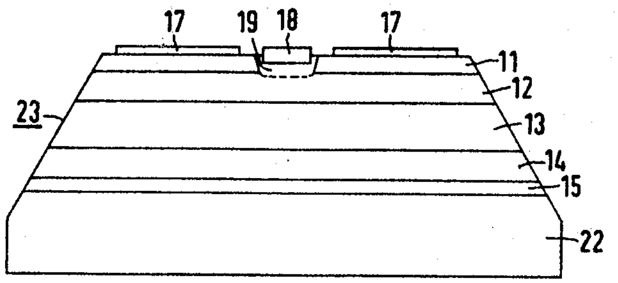
FIG. 2 shows the cross section of a thyristor produced by diffusion.

The thyristor of FIG. 2 is comprised of a monocrystalline silicon disc 23, having four regions 11 to 14, produced through indiffusion of an appropriate dopant of alternate conductance type. The emitter region 11 and the base region 13 are n-conducting, the base region 12 and the emitter region 14 are p-conducting. A gold foil, containing acceptor contaminations, was so alloyed into the center of the emitter region 11, to form control electrode 18, and the p-conducting recrystallization region 19 which is in contact with the p-conducting base region 12. An aluminum electrode 17 is vapor deposited upon the surface of the emitter region 11. On the surface of the emitter region 14 is a contact electrode 15, comprised of the eutectic silicon aluminum alloy. A carrier body 22 of molybdenum is attached at contact electrode 15 by heating under pressure.

To produce the thyristor of FIG. 2, a disc of n-conducting monocrystalline silicon may be used which has the same geometrical dimensions, the same specific resistance, the same dislocation density and the same oxygen content as that used to produce the thyristor, of FIG. 1. As in the case of the thyristor of FIG. 1, acceptor material is first indiffused, on all sides, into the silicon disc. Thereafter, the thus developed p-conducting surface region is redoped in a boundary layer beneath the surface on all sides by indiffusion of donor material, such as for example, phosphorus so that this layer will be of the same conductance type as the original disc. This redoped layer is removed from one flat side of the disc, for example through lapping and/or etching and gold is vapor deposited which, just as in thyristor of FIG. 1, is diffused into the disc with formation of recombination centers. Finally, an aluminum foil and a molybdenum body are alloyed-in at the flat side to form the electrode 15 of silicon-aluminum eutectic, and molybdenum body 22. On the other flat side, a gold foil is alloyed in, under formation of the electrode 18. An aluminum layer, surrounding electrode 18, is then vapor deposited to form electrode 17. The surface of the silicon disc 23 is bevelled, for example by means of sand blasting and subsequent etching to give regions 11 to 14, which are separated from each other.

The dislocation density of the original silicon disc is unchanged in the cross sections, parallel to the flat sides, which are laid through those regions of the finished thyristor which are not within the recrystallization regions of electrodes 15 and 18.

One or more of the regions 11 to 14 of the thyristor of FIG. 2 may also be produced by epitactic precipitation of silicon, containing appropriate doping material, upon the monocrystalline silicon disc. In this case also, the original dislocation density is maintained in the cross sections of the finished transistor, which are laid through the original monocrystalline silicon disc.

The features, operational processes and teaching derived from the above disclosure and/or from the accompanying drawing disclosed here for the first time, as valuable inventive improvements, are to be regarded individually as well as in combination with each other.

We claim:

1. A semiconductor component with a flat monocrystalline semiconductor body, which has across its thickness at least two regions of opposite conductance types with a p-n junction between them, and which contains a substance which forms recombination centers, said substance having solubility which decreases in the semiconductor body with decreasing temperature, said semiconductor body being at least almost free of dislocations and having an oxygen content of less than $10^{16}$ atoms/cm.$^3$.

2. The semiconductor component of claim 1, wherein the median dislocation density over the entire surface of any given cross section, parallel to the flat sides of the semiconductor body, wherein the crystal structure of the original body was maintained is less than 1000/cm.$^2$ and the local values of the dislocation density, of squares whose sides equal the thickness of the semiconductor body, are below 10,000/cm.$^2$.

3. The semiconductor component of claim 2, wherein the local values of the dislocation density of squares whose sides are ⅕ the thickness of the semiconductor body, are less than 10,000/cm.$^2$.

4. The semiconductor component of claim 1, wherein the median dislocation value across a total surface of more than 8/cm.$^2$ of any given cross section, parallel to the flat sides of the semiconductor body, wherein the crystal structure of the crude body was maintained, is less than 20,000/cm.$^2$ and the local values of the dislocation density, of squares whose sides equal the thickness of the semiconductor body, are below 50,000/cm.$^2$.

5. The semiconductor component of claim 4, wherein the local values of the dislocation density, of squares whose sides equal ⅕ of the thickness of semiconductor bodies, are below 50,000/cm.$^2$.

6. The semiconductor component of claim 1, wherein the conductance type of at least one region is determined by an indiffused doping substance.

References Cited

UNITED STATES PATENTS

| | | | |
|---|---|---|---|
| 3,377,182 | 4/1968 | Von Bernuth | 117—4 |
| 3,356,543 | 12/1967 | Desmond | 148—186 |
| 3,349,299 | 10/1967 | Herlet | 317—235 |
| 3,342,651 | 9/1967 | Rathel | 148—188 |

JOHN W. HUCKERT, Primary Examiner

M. EDLOW, Assistant Examiner

U.S. Cl. X.R.

317—235